United States Patent
Koplin

(10) Patent No.: US 6,776,707 B2
(45) Date of Patent: Aug. 17, 2004

(54) COMPUTER CABINET

(75) Inventor: Edward C. Koplin, Baltimore, MD (US)

(73) Assignee: Engineering Equipment and Services, Inc., Timonium, MD (US)

(*) Notice: Subject to any disclaimer, the term of this patent is extended or adjusted under 35 U.S.C. 154(b) by 0 days.

(21) Appl. No.: 10/425,095

(22) Filed: Apr. 28, 2003

(65) Prior Publication Data

US 2004/0023614 A1 Feb. 5, 2004

Related U.S. Application Data

(63) Continuation-in-part of application No. 09/453,799, filed on Dec. 3, 1999, now Pat. No. 6,554,697, which is a continuation-in-part of application No. 09/223,002, filed on Dec. 30, 1998, now abandoned.

(51) Int. Cl.[7] ................................................ H05K 5/00
(52) U.S. Cl. ....................................... 454/184; 361/694
(58) Field of Search ................................ 454/184, 334; 361/690, 694, 695; 312/116, 236, 351

(56) References Cited

U.S. PATENT DOCUMENTS

| | | | |
|---|---|---|---|
| 1,111,805 A | 9/1914 | Pykett ...................... 126/285 R |
| 3,348,609 A | 10/1967 | Dubin et al. .................. 165/47 |
| 3,714,793 A | 2/1973 | Eigenbrod ...................... 62/62 |
| 3,756,218 A | 9/1973 | Simpson ...................... 126/540 |
| 3,903,404 A | 9/1975 | Beall et al. .................. 361/687 |
| 3,942,426 A | 3/1976 | Binks et al. ................... 99/473 |
| 4,016,357 A | 4/1977 | Abrahamsen ................. 174/48 |
| 4,275,538 A | 6/1981 | Bounds ......................... 52/299 |
| 4,458,296 A | 7/1984 | Bryant et al. ................ 361/691 |
| 4,513,351 A | 4/1985 | Davis et al. ................. 361/695 |
| 4,767,262 A | 8/1988 | Simon ......................... 415/199 |
| 4,774,631 A | 9/1988 | Okuyama et al. ............ 361/695 |
| 4,845,380 A | 7/1989 | Piegari ........................ 307/149 |
| 4,874,127 A | 10/1989 | Collier ....................... 236/49.5 |
| 5,150,277 A | 9/1992 | Bainbridge et al. .......... 361/695 |
| 5,206,772 A * | 4/1993 | Hirano et al. ............. 360/98.01 |
| 5,297,004 A | 3/1994 | Mazura ....................... 361/690 |
| 5,335,144 A | 8/1994 | Maroushek ................. 361/695 |
| 5,345,779 A | 9/1994 | Feeney ....................... 62/259.2 |
| 5,398,666 A | 3/1995 | Smith et al. ............... 126/21 A |
| 5,431,490 A | 7/1995 | Edwards ...................... 312/116 |
| 5,467,250 A | 11/1995 | Howard et al. ............. 361/696 |
| 5,467,609 A * | 11/1995 | Feeney ....................... 62/259.2 |
| 5,508,890 A | 4/1996 | Hirata ......................... 361/829 |
| 5,544,012 A | 8/1996 | Koike ......................... 361/695 |
| 5,684,674 A | 11/1997 | Yin ............................. 361/695 |
| 5,718,628 A | 2/1998 | Nakazato et al. ............ 454/184 |
| 5,729,996 A | 3/1998 | Barger ......................... 62/288 |
| 5,766,453 A | 6/1998 | Morellato et al. ........... 210/143 |
| 5,782,546 A | 7/1998 | Iwatare ....................... 312/236 |
| 5,800,258 A | 9/1998 | Knoop et al. ............... 454/184 |
| 5,845,631 A | 12/1998 | Kleva et al. ............... 126/21 A |
| 6,412,292 B2 * | 7/2002 | Spinazzola et al. ............ 62/89 |

OTHER PUBLICATIONS

"Enclosure Cooling With Fans and Fins", Machine Design, US, Penton, Inc. Cleveland, vol. 67, No. 2, Jan. 26, 1995, pp. 109–110.

* cited by examiner

*Primary Examiner*—Derek S. Boles
(74) *Attorney, Agent, or Firm*—Lieberman & Brandsdorfer, LLC

(57) ABSTRACT

A cabinet adapted to house electronic and communication equipment therein. The cabinet includes modifiable top, bottom and side walls. Grommets with notches are provided to accommodate passage of wires and cables into and out of the cabinet. The notches function to receive the wires and/or cables and to mitigate passage of air through the grommet. A micro controller is provided for each individual cabinet to both monitor and control variants within the cabinet. The micro controller may be accessed on site with a local operator, or remotely through a memory addressable system.

34 Claims, 13 Drawing Sheets

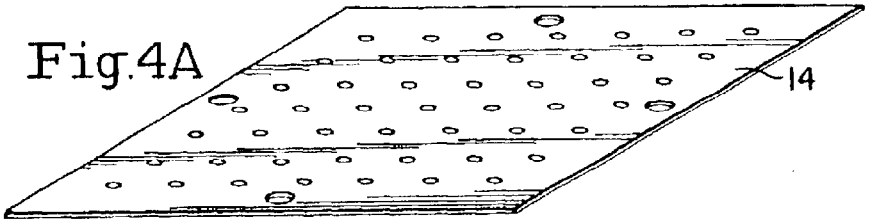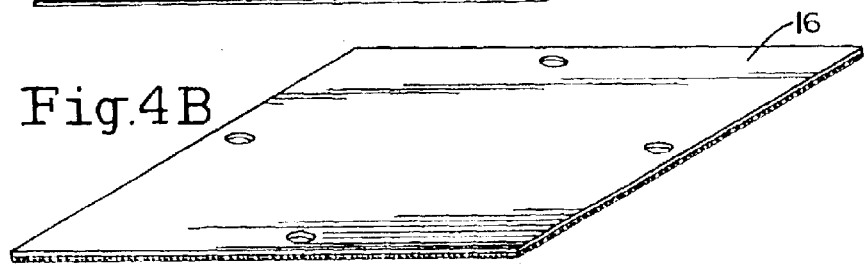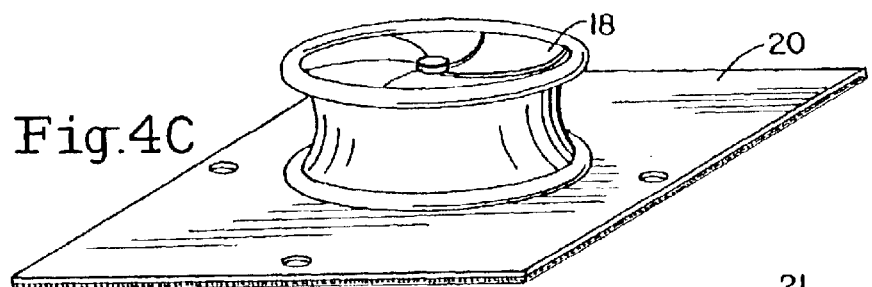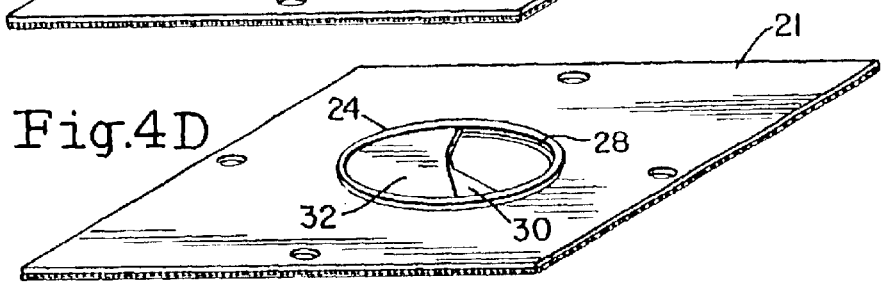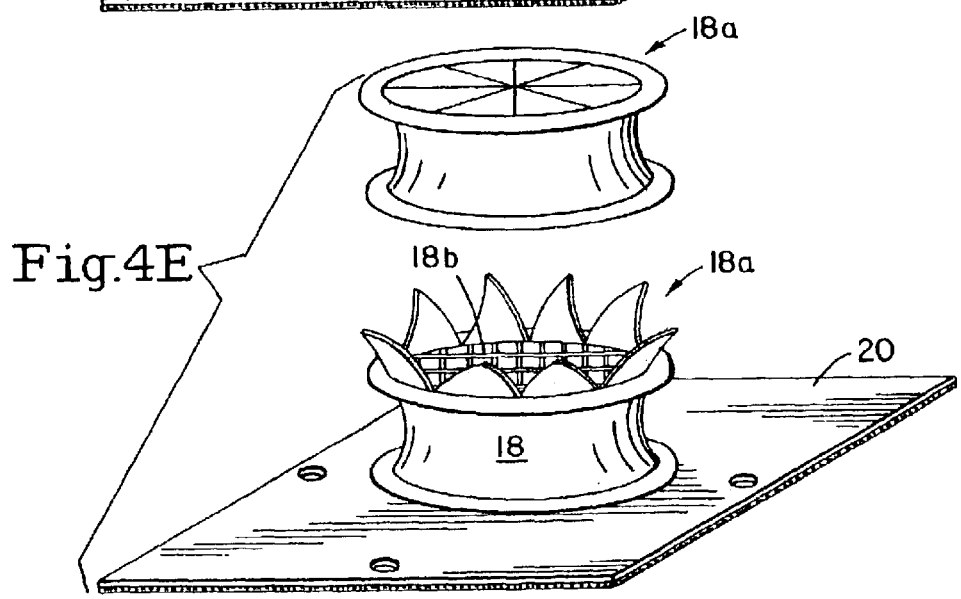

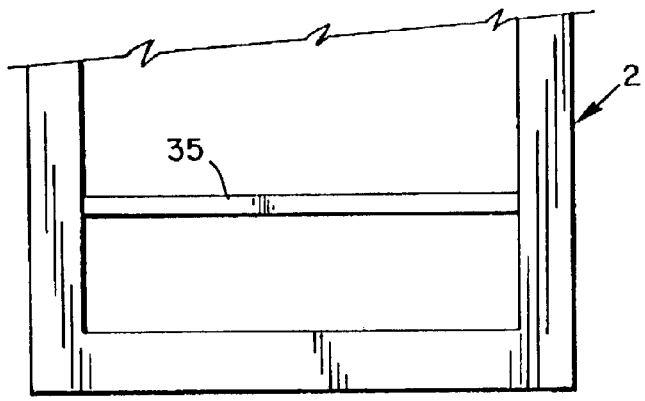
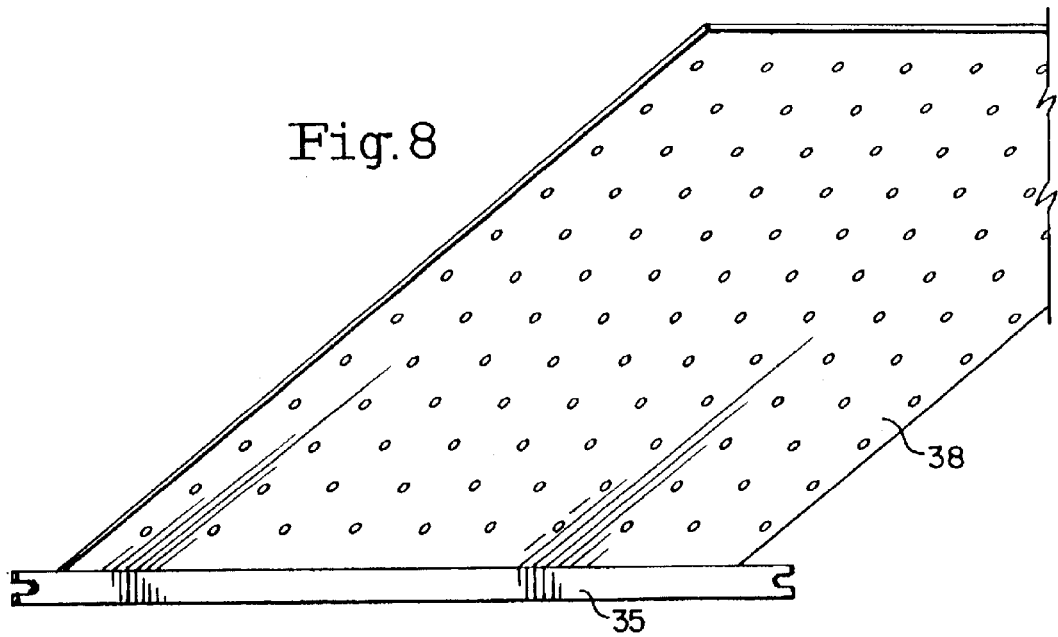
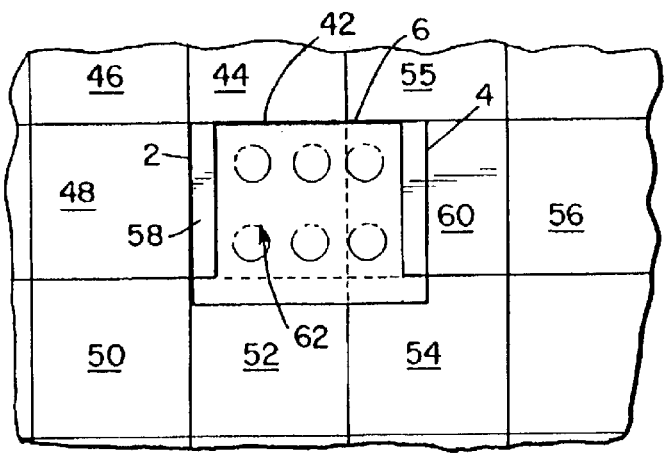

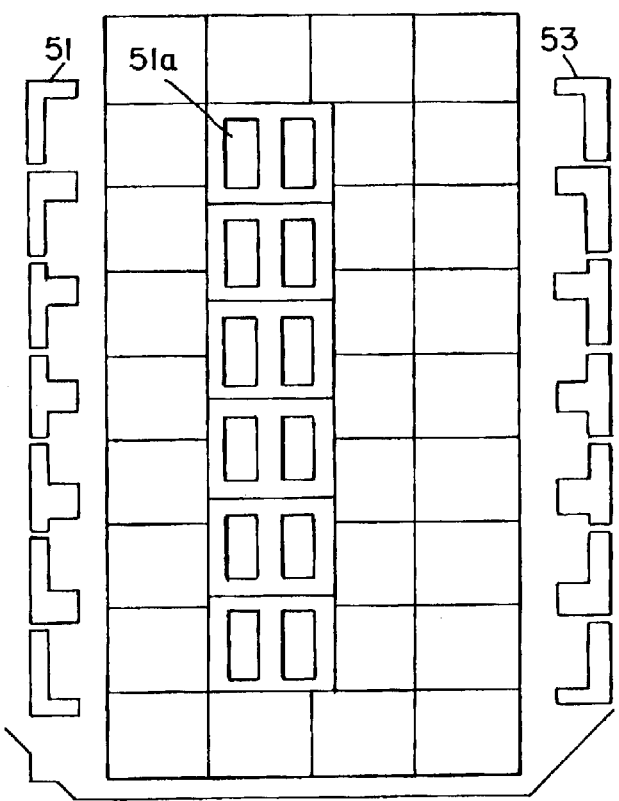
Fig.9B
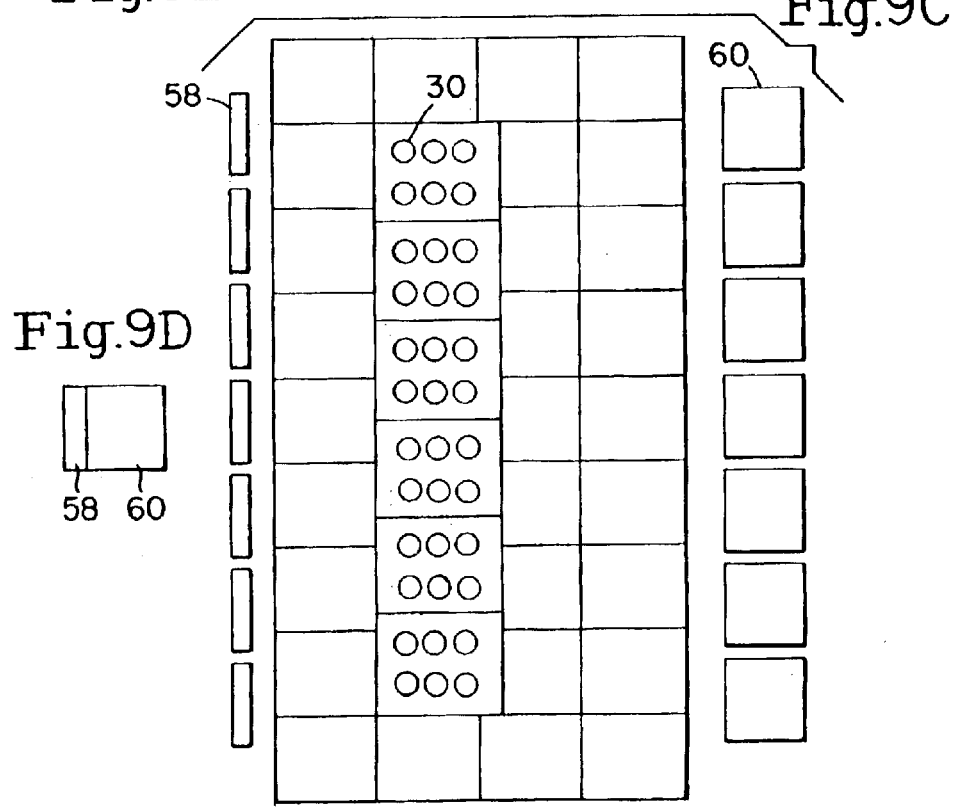
Fig.9C
Fig.9D

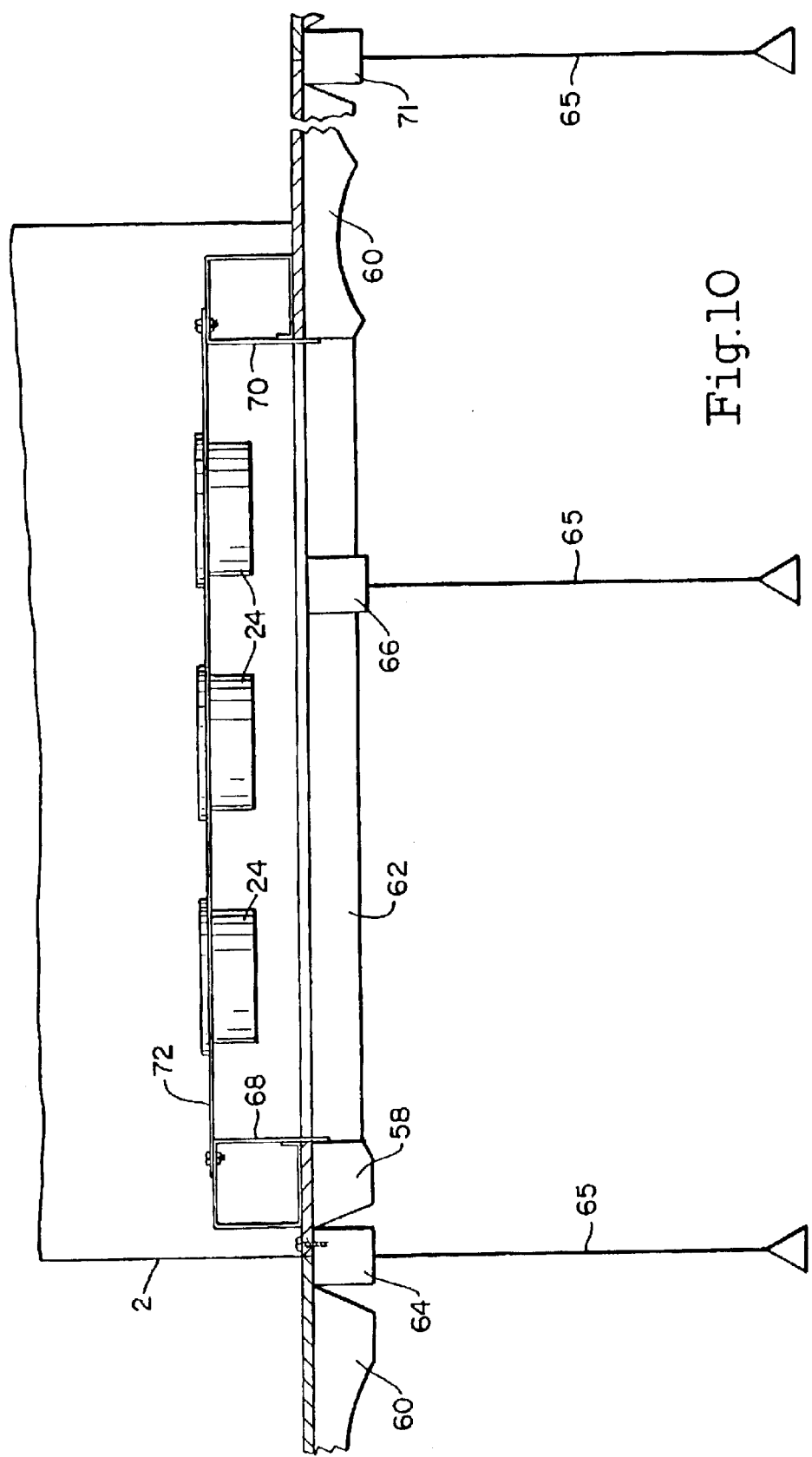

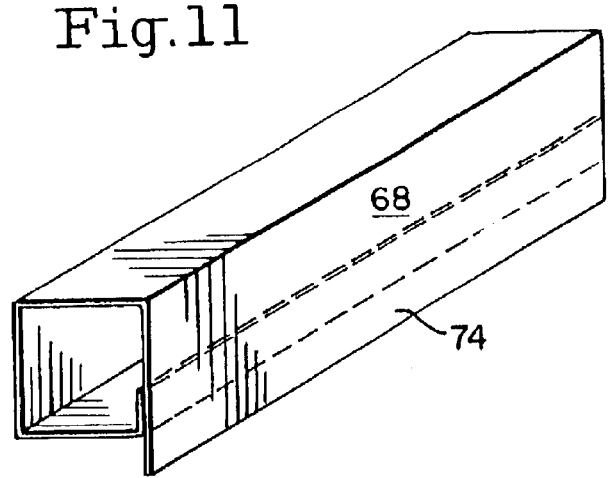
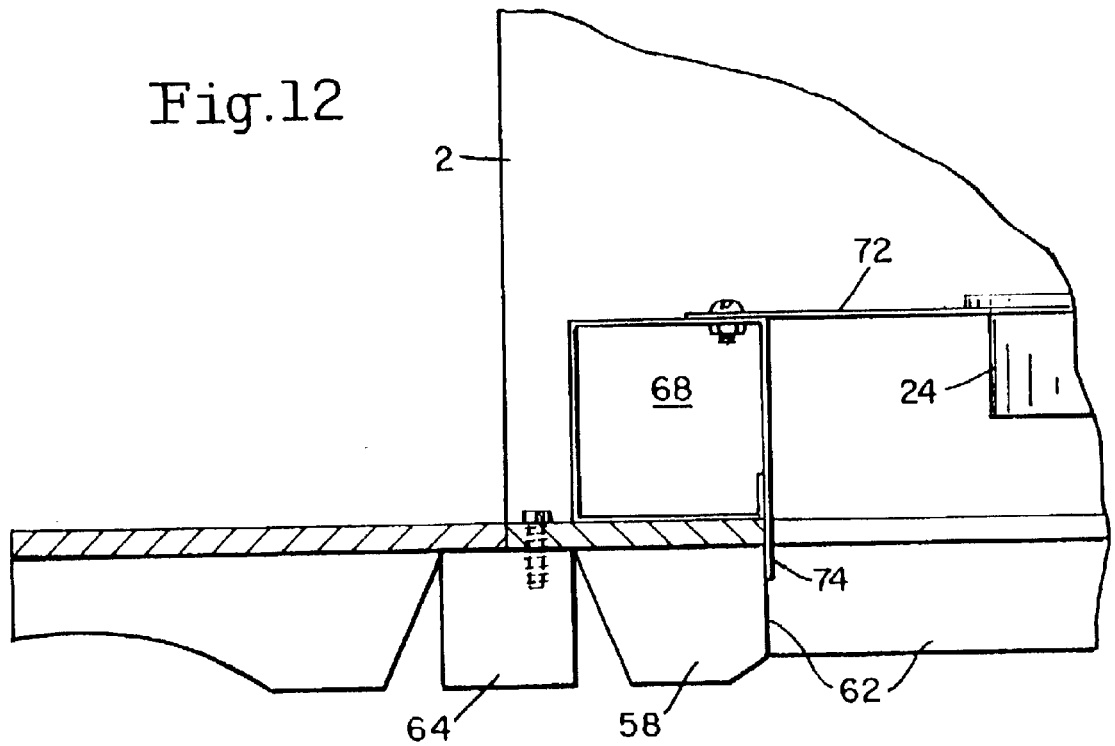

COMPUTER CABINET

CROSS REFERENCE TO RELATED APPLICATION(S)

This application is a continuation-in-part of application Ser. No. 09/453,799 filed Dec. 3, 1999 now U.S. Pat. No. 6,554,697, which is a continuation-in-part of application Ser. No. 09/223,002 filed Dec. 30, 1998, now abandoned.

BACKGROUND OF THE INVENTION

1. Technical Field

This invention relates to a system for cooling heat producing products stored within an enclosure. More specifically, the system includes an apparatus for monitoring and controlling conditions within the enclosure.

2. Description of the Prior Art

Most cabinet cooling systems are not integrated with a fault tolerant concurrently maintainable and transparently expandable design that integrates with a raised floor or overhead cooling system to accomplish reasonable control overheating of heat producing product stored within the cabinet. Heat produced by equipment in high technology systems exceed the capacity of cabinets currently available. Without an effective cooling system, heat producing electronic equipment is susceptible to overheating.

Often, expensive quality uninterruptible power systems (UPS) are installed for both the computer systems and cabinet fan powered cooling assemblies. Existing cabinet cooling technologies waste available UPS power because methods do not exist to vary cooling energy as a percentage of the power required to cool the electronic heat producing equipment installed in the cabinets. A conventional cabinet for storing computers and peripheral equipment will include a fan. However, the fan is generally non-redundant and improperly sized to cool the cabinet and the product(s) housed therein, and the expensive UPS is wasted.

When the cabinet is initially populated, the cooling system in the cabinet may be sufficient to handle the heat loads expected from housing electronic equipment therein. However, these cooling systems are static in that they are not designed to accommodate a load greater than the initial design. Fan cooling systems for conventional cabinets that are initially sized to accommodate maximum cabinet leads waste UPS capacity. There are many industries that cannot readily accept down time of equipment to accommodate changes. Examples of such industries include railway, production line control systems, financial markets, air travel reservation centers, and the like. Accordingly, there is a need for a dynamic cabinet cooling system.

In addition to providing a static cooling system, the cabinet industry practice is to provide large cuts in a raised floor that are left open with only a few square inches containing any cables or wires. Cooling air is drained from the raised floor unimpeded through the excessive cable openings. This results in loss of air and static pressure that is needed for cooling elements or equipment in other cabinets housed in the room. Overhead cooling is distributed from overhead ducts and a method is required to efficiently distribute this cool air to heat producing equipment in the cabinet. If the cool air is not efficiently distributed in the room, the heat producing equipment is wasting capacity and placing the heat producing equipment stored in the cabinet at risk. Elevated floor tiles designed to accommodate the cabinet and to provide adequate support for the cabinet cost approximately $100 per tile, and is labor intensive for installation. Cutting of the tiles in association with cabinet installation is time consuming and generally expensive, as well. The prior art does not provide a solution to integrate the floor and the cabinet(s) for efficient operation of the cabinet environment.

In a significant number of large installations, cabinets are set in a side-by-side fashion without walls between adjacent cabinets. An entire interior area may be considered as a single entity resulting in large amounts of fans used in aggregate and wasted critical power. In these installations, a fan or perhaps two fans are located in a top wall of the cabinets and may be programmed to operate at a fixed speed. A cabinet with a large heat load may be positioned next to a cabinet with a small heat load. Yet the fan associated with the later cabinet may be operating at full speed. The standard procedure in such systems with separations between adjacent cabinets is to operate the fans at a standard speed regardless of load. This procedure wastes power and cooling capacity. In general, less than 10% of the power supplied to the cabinet should be used for cooling. The remaining power capacity should be set aside for operating the equipment stored within the cabinet. Accordingly, effort should be focused on conserving cooling capacity set aside for cooling the equipment stored within the cabinet.

Electronic equipment housed within the cabinets has wires that are connected to power supplies and cables that are connected to communication equipment. Large losses of cooling energy are encountered through openings in the cabinets through which cables and wires are introduced into the cabinets. Inadequate use of masking or structural features to provide shielding is encountered in the prior art. For example, prior art cabinets are not designed to accommodate adjustments in the field to the environment. Openings cut in the cabinet during installation or subsequent to installation are generally made to enable technicians to pull wires and cables. However, such openings are generally too large to enable support or adjustment for the cooling system of the cabinet. In many cases, the cabinets are pre-wired and left unpowered, waiting months for operating loads to materialize. Yet, the openings left by the installing technicians would not be closed. Any and all air passing through these access openings under the floor waste cooling capacity and static pressure. As the air is wasted from one area of the room, other areas in the room are placed at risk. These openings fail to properly control cooling capacity and static pressure. Furthermore, the problem of wasted cooling capacity can not be corrected even if other critical systems are adversely affected once the cabinet(s) is used to house telecommunications or critical electronic equipment because of the need for continuous data and telecommunications processing from that equipment. Such systems do not enable shutdown of operations to correct the problem. Retrofitting existing cabinets with an on-line processing load is nearly impossible to accomplish without risk. This latter procedure relates to the cooling capacity and pressure under tile floors and the need to insure that each cabinet drains off minimum cooling air and produces minimum pressure drop once the cabinet is installed. Accordingly, a transparently scalable system to adjust cooling capacity without risk is a critical process.

There is therefore a need for a cabinet designed to house electronic and/or telecommunication equipment with an automatic and dynamic cooling means. Such a cabinet must be able to house the equipment while still allowing for modification of cooling requirements during use of the installed equipment.

SUMMARY OF THE INVENTION

This invention comprises a system for cooling a cabinet housing heat producing elements.

In a first aspect of the invention, the system includes an enclosure with an interior area. The enclosure includes a top wall, a bottom wall, and a shelf located in a fixed position. The bottom wall has a variable size opening therein. The shelf is positioned to enable flow of cooling gas through the variable size opening and to permit access to the variable size opening. The top wall has an opening. A plurality of panels are selectively insertable into the opening in the top wall. One of the panels is adapted to control air flow through the opening in the top wall. Both means for inducting cool ambient air into the enclosure and means for dynamically controlling conditions within the enclosure are provided. In addition, a dual source power cord processor may be provided to deliver current to electronic equipment within the cabinet. The air inducting means preferably includes six variable speed fans. The dynamic cabinet control means preferably includes an input/output micro controller adapted to monitor variants within the enclosure. In addition, the micro controller is preferably adapted to vary operating speed of the fans within the enclosure. Finally, the enclosure may include a captive fastener for securing the panel of the top wall of the enclosure.

In a second aspect of the invention, a method for cooling a cabinet containing heat producing elements is provided. The cabinet has an interior with a top wall having an opening, and a bottom wall having a variable size opening. The method includes positioning a shelf for enabling flow of cooling gas through the variable size opening and permitting access thereto, and selectively inserting a panel into the top wall opening for controlling air flow through the opening. The method also includes inducting cool ambient air into the cabinet. Conditions within the cabinet are dynamically controlled by means of an input/output micro controller, which also may monitor variants within the cabinet. The variants may include temperature, power, door access, vibration, humidity, and fan speed. A plurality of micro controller may be connected through a communication network, wherein the network may be monitored through a server. A message may be sent from a micro controller within the network to a remote location for conveying operating conditions within an individual cabinet in an array of cabinets. In addition, variants among a plurality of cabinets in a single room may be balanced. Accordingly, the second aspect provides a method for dynamically monitoring and controlling variants within an interior of the cabinet.

Other features and advantages of this invention will become apparent from the following detailed description of the presently preferred embodiment of the invention, taken in conjunction with the accompanying drawings.

BRIEF DESCRIPTION OF THE DRAWINGS

FIGS. 4a–4e illustrate various configurations of panels that may be employed with the top surface of the cabinet illustrated in FIG. 3.

FIG. 7 illustrates the placement of the bottom shelf of the cabinet placed to permit access to the grommets.

FIG. 8 is an isometric view of a perforated shelf employed in the present invention.

FIGS. 9a–9d illustrate the arrangement of the cabinet on the floor tiles and the modification of the tiles to provide access for the cabinet to the cold air under the tiles.

FIG. 10 is a front view in elevation of the placement of a cabinet over an open area of the access flooring installation providing access of the interior of the cabinet to the pressurized cold air.

FIG. 11 illustrated a tile stop employed with the structure of FIG. 9.

FIG. 12 provides a detailed view of the use of the tile stop in conjunction with a factory supplied pre-cut tile.

DESCRIPTION OF THE PREFERRED EMBODIMENT

Overview

A cabinet designed to house electronic and/or telecommunication equipment is provided. The cabinet has a variable speed fan to maintain an interior temperature within the cabinet to enable the equipment to continue operating. The cabinet also includes a micro controller to both monitor and control variants within the cabinet, as well as operation of the fan. The micro controller functions to maintain the cabinets in an operating condition, and to modify any controllable variant that fails to operate.

Technical Details

Figure 1:
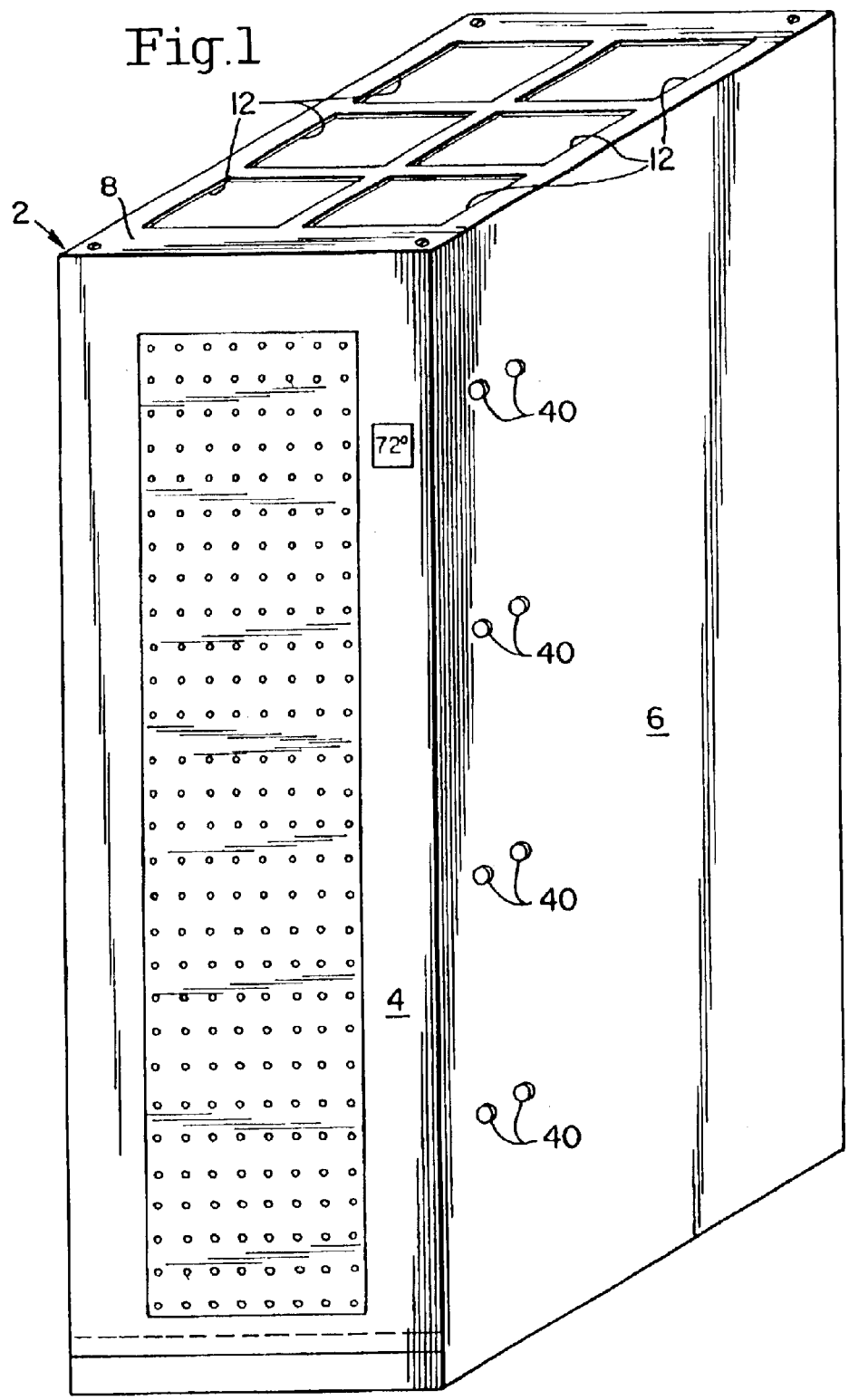
FIG. 1 is an isometric view of a cabinet according to the present invention.
Figure 2:
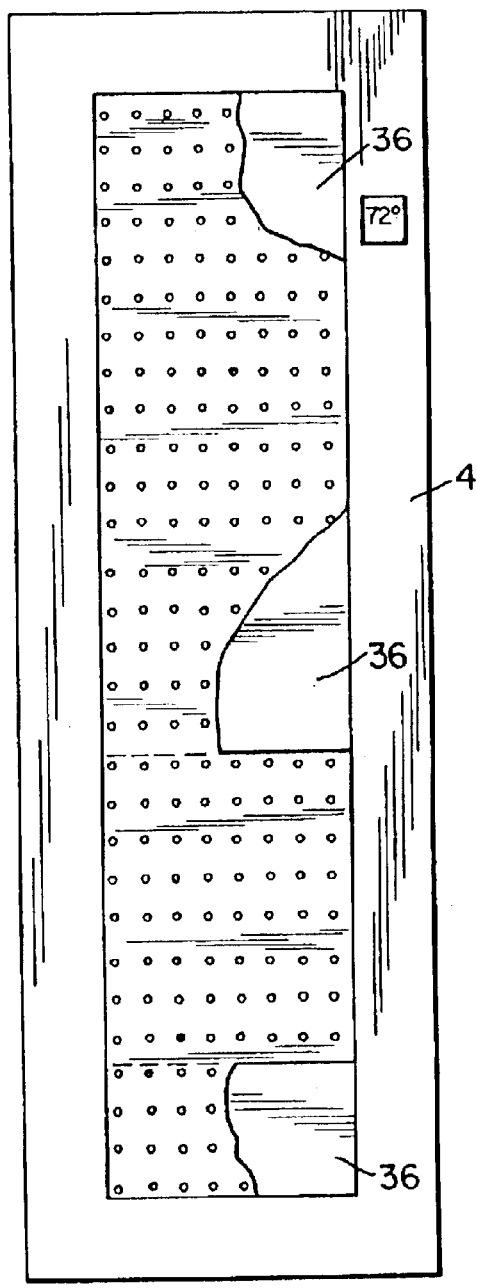
FIG. 2 is a front view of the cabinet with blank panels installed behind the perforated front door of the cabinet.
Figure 5:
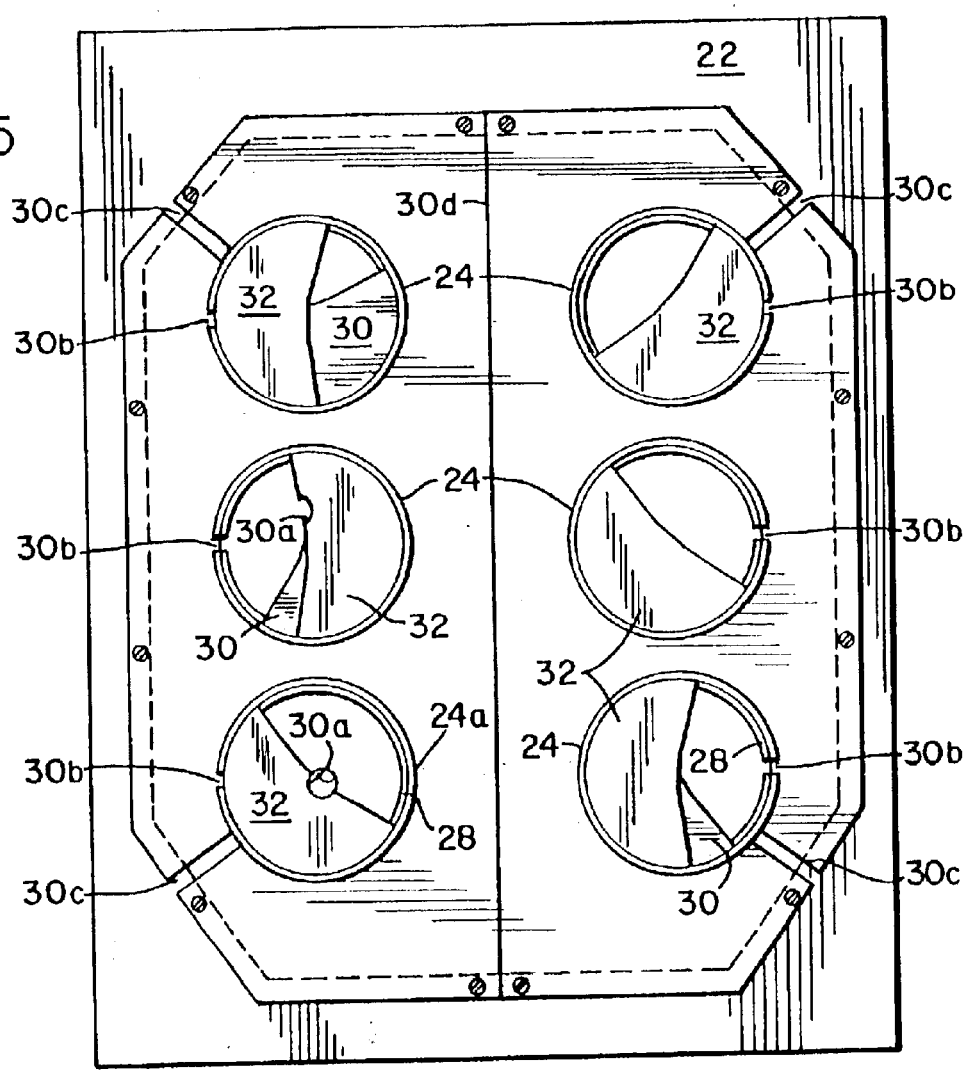
FIG. 5 illustrates the bottom panel of the cabinet with the grommets for controlling cold air flow into the cabinets, allowing wires to be pulled into the cabinet and subsequently closed around the wire to prevent cooling loss.

Referring now to FIGS. 1 and 2 of the accompanying drawings, a cabinet 2 is shown with a perforated front door 4, side walls 6, only one of which is illustrated, a back wall (not shown), and a top wall 8. A bottom wall 22 of the cabinet 2 is shown in FIG. 5. It is to be noted that the back wall panel may be perforated, and in a single cabinet designed to function as an isolated model, the side panels may also be perforated. The top wall 8 has at least one opening 12 adapted to receive a panel, and may have as many as six openings. The panel may be highly perforated 14, as shown in FIG. 4A, a solid panel, as shown in FIG. 4B, a panel having a fan bearing 20 with a fan 18 mounted therein, as shown in FIG. 4C, a panel with a grommet 24 as shown in FIG. 4D, or a panel with a backdraft assembly as shown in FIG. 4E. Accordingly, the top wall may be fitted with an assortment of panel assemblies.

As shown in FIG. 4E, the fan may be fitted with a lightweight backdraft assembly 18a to prevent loss of capacity when the operating fans attempt to short cycle ventilating air through an inoperable fan. The backdraft assembly includes a grating 18b provided to support the backdraft assembly 18a and to protect the fan blades. The backdraft assembly 18a is comprised of a plurality of sections. When the fan is in operation, the sections of the assembly 18a are lifted as shown in FIG. 4E. In a preferred embodiment, the sections of the assembly 18a are made of a lightweight material, such as a nylon fabric, an elastomeric material, or another lightweight flexible.

Figure 3:
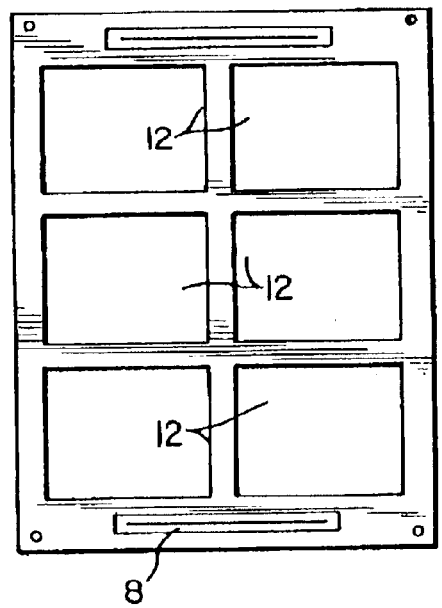
FIG. 3 is a view of the top surface of a cabinet providing for up to six spaces for blank panels, perforated panels, or having fans mounted thereon.

The structure of the top wall 8 is illustrated in greater detail in FIG. 3. Each opening 12 is approximately 8½" deep and 11⅛" wide in one embodiment of the invention. The perforated panel 14 of the top wall is employed when a single fan or multiple fans are not in use. Panel 16 is employed when a single fan or multiple fans are operating in one of the other openings of the top wall, and panel 20 is employed to provide induced air flow through the cabinet. Each panel secured to the cabinet is preferably secured thereto with a captive fastener. This enables an operator of the cabinet to install the panel without concern for loss of the fastener. A loose metal fastener can be harmful in a cabinet storing electronic equipment. Accordingly, the top wall has at least one opening that may be modified with several different structures shown in FIGS. 4A–4E to support the functionality of the cabinet.

Figure 6:
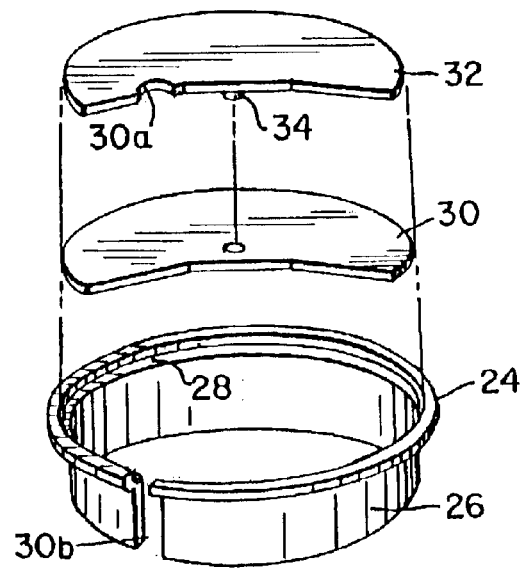
FIG. 6 is a detailed view of one of the grommets.

The bottom wall of the cabinet is shown in FIG. 5 and is designated by reference numeral 22. The bottom wall is shown as having six openings with a grommet 24 situated in each opening. The bottom wall has a seam 30d that bisects the cover plate 31. The seam allows the cover plate 31 to be retrofitted into an existing cabinet with existing wires. Each grommet is adjustable to provide no opening, half an opening with two blades, or a quarter opening with four blades. The grommet may also be removed from the wall to provide a full opening. In use, two disc shaped members 30 and 32 may be seated. The members rotate about a small pivot pin 34 that joins the two members. By rotating the members relative to one another, the size of the opening may be controlled. Wiring for the components to be situated in the cabinet may be brought in through the opening provided by openings left in the access floor system that the cabinet is installed over, as shown in FIG. 10. The grommets may be closed sufficiently to block all air except for leakage past the cables as the cables and wires are brought into the cabinet through one of the grommets 24a in FIG. 5. The two plates 30 and 32 of grommet 24a are shown with notches 30a adapted to receive wires and cables therein. The use of the notches mitigates air flow through the opening caused by the passage of wires and/or cables through the grommet. Accordingly, the wires and cables may all fit within the notch to enable the plates of the grommet to close while allowing passage of wire and/or cables. In addition, as shown in FIG. 6, a slot 30b is provided in the sidewall of the grommet 24. The slot 30b allows the grommet 24 to be inserted around an existing group of wires. The slot 30b prevents the need to disconnect any existing wires when the grommet is retrofitted to an existing situation.

The interior of the cabinet 2 has a preinstalled shelf 35, as shown in FIG. 7. The shelf 35 is placed in the cabinet to prevent reduction of fluid flow from below the floor by preventing the use of the area occupied by the shelf 35 by any equipment or other items. At the same time, the shelf provides uninhibited access to the grommets and wires in the bottom wall and permits adjustment as required. The gauge of the metal plate is such that manually cut slots, such as slot 30b or 30c illustrated in FIG. 5, may be created for slipping the plate around existing wires without disconnecting equipment. In addition, the plate itself may be supplied in two pieces with an overlapping seam so that the two pieces can be inserted into an existing cabinet and then fastened together.

In addition to the pre-installed shelf 35, the cabinet is designed to accommodate installation of secondary shelves 38 on site. The secondary shelves 38 are perforated to enable cooling air to flow freely about all surfaces of the equipment resting on the shelves. For example, the shelves may have as many as 75 perforations per square foot providing a 50% free area. Accordingly, both the pre-installed shelf 35 and the secondary shelves 38 are designed to accommodate storage of equipment while contributing to maintaining the interior environmental conditions of the cabinet.

The quantity of grommets and openings provided for panels in the top of the cabinet may be chosen to suit the needs of the system in which the apparatus is to operate. If the heat load is low, the grommets in the bottom of the cabinet may be closed and all of the top panel openings left open. If fans are installed, a microprocessor controlling fans will slow down the speed of the fans until they eventually reach minimum speed to conserve UPS capacity. Convection currents will bring air in through an adjustable panel 36a in the front door to produce effective cooling with convection, i.e. convection cooling allows room air to cool equipment without using UPS power to operate the fans. If the heat load is at a maximum, six fans may be used in the panels of the top wall and the grommets in the bottom of the cabinet may be opened to the maximum extent. The microprocessor will adjust the fan speed to 83% of capacity. In the event of a fan failure, the remaining fans will increase their speed to 100% capacity to maintain cooling. An alarm is generated locally and over a communication network. In this case, the open panel 36a, as shown in FIG. 2, may be adjusted behind the perforated door 4 to further control air flow through the door. In some embodiments of the invention, air flow through the door is essential for proper operation and the blank panels are removed to permit maximum flow through the door. Additionally, the open panels allow ventilation air from the room to mix with cold air from the floor. In this manner, higher volumes of air can be used without depleting static pressure in the raised floor.

FIG. 9b illustrates a conventional prior art approach to supporting a group of cabinets of the same size as those of the present invention. Each cabinet is supported over two or more tiles, in which the tiles must be cut to properly support and position the cabinet over an opening 51a. The opening 51a is needed for cables and/or air flow. In FIG. 9b, the elements 51 along the left side of the figure to elements 53 along the right side of the figure illustrate the remainder of the tiles after cutting to accommodate the cabinet.

Figure 15:
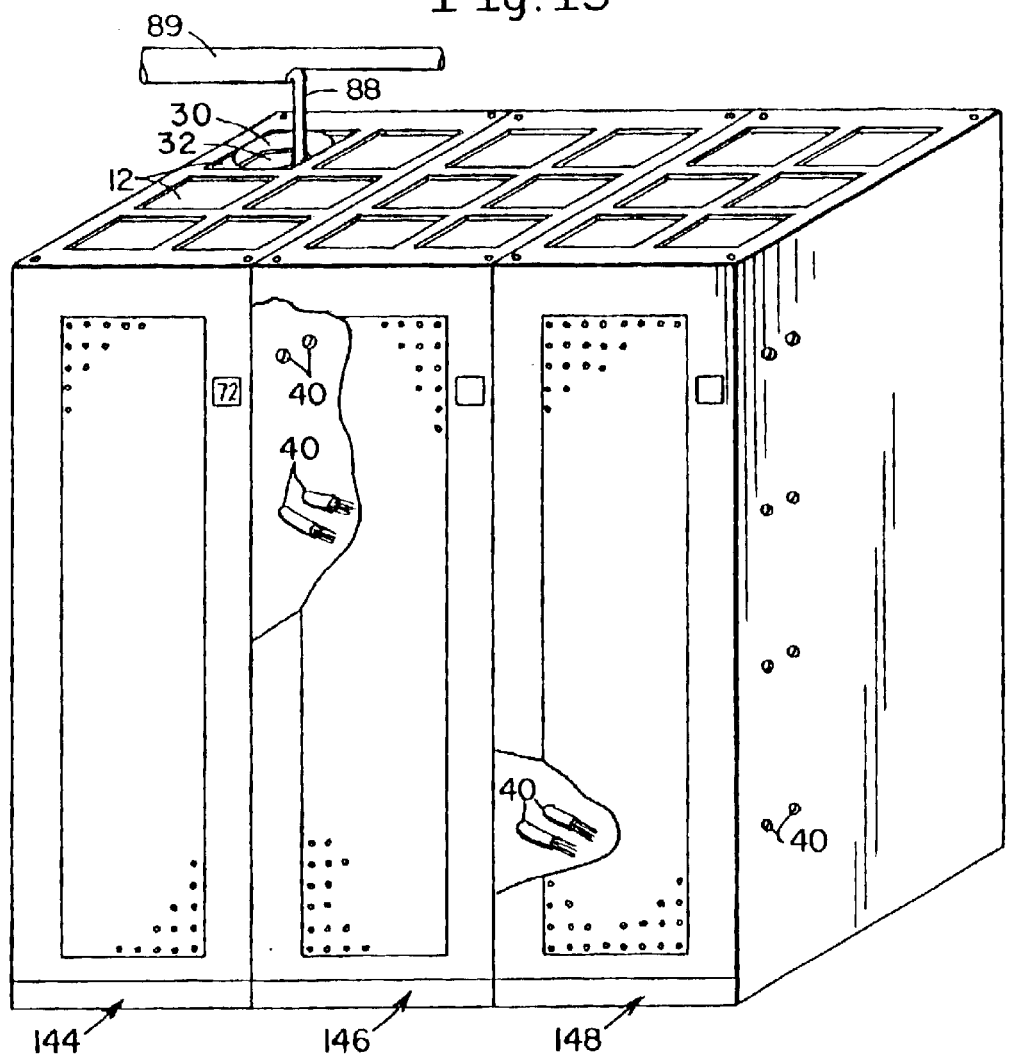
FIG. 15 illustrates an arrangement in which several cabinets are located side-by-side and cabling is brought into each cabinet from an overhead cable tray through grommets in the top wall that replaces the panels illustrated in FIG. 1. One of the panels 12 of FIG. 1 is replaced by a grommet and wires and cables are or may be brought into the cabinet through that grommet in the top wall.

The cabinets may be situated on tiles in groups, side by side with the sides of the cabinets in contact, as shown in FIGS. 9b, 9c, and 15. Each cabinet remains isolated and control of air conditioning within a cabinet is under individual control for each specific cabinet. However, if desired, controls of adjacent cabinets may be interrelated by passage of wires between cabinets through the side walls. In some installations, groups of cabinets can run 20 to 30 cabinets, depending upon the geometry of the room and other physical conditions. In a preferred embodiment, the cabinets are 36 inches by 28 inches on the floor, and each floor tile is 24 inches by 24 inches. Thus, the width of the cabinet overlaps an access floor tile side seam. Each cabinet is supported by several tiles. With these dimensions, a group of six cabinets line up evenly with the side seams of seven tiles, thereby eliminating the need to cut the tiles subsequent to their installment. In fact, a single tile can be precut and trimmed to form the necessary section with one straight saw cut and without waste. Wires may be passed through the side walls from one cabinet to another cabinet via holes 40 (see FIG. 1). A break between cabinets, about every 6 to 12 cabinets is recommended to permit service personnel access to the cabinets and to minimize problems with locating cabinets and cutting tiles. The cabinets are located on the floor to allow the floor tile adjacent to the back of the cabinet to be lifted to permit access to the area under the tile and cabinet.

FIG. 9a illustrates the position of one cabinet on the tiles of the elevated floors. The door 4 of the cabinet is to the right, while the right side 6 of the cabinet sits approximately along the edge 42 of the tiles labeled 44 and 55. As shown in FIG. 10, the right side of the cabinet is supported over a beam 62. The back wall of the cabinet 2 sits on tiles 54 and 52. The factory supplied tiles 58 and 60 accommodate a cabinet to the floor and permit support to be provided by the floor support pedestals. As can be seen in FIG. 9a, the cabinet is supported on tiles 42, 53, 54 and 56 and partial factory supplied tiles 58 and 60, for a total of two full tiles and two partial tiles. Previous installation practices require custom cutting of expensive floor tiles to provide an opening through the tiles into the region below the elevated floor, see FIG. 9b. In the prior art, each tile had to be custom field cut so that the opening in the cabinet would line up with the cut floor tile. The end result was wasted floor tile 51 and 53. The present invention allows the floor tile manufacturer to precut 6 inch tiles 58 and 18 inch by 24 inch panel 60 at the back and front of the cabinet. The structure discussed leaves a center opening 62 for access to the cold region below the tile. The horizontal depth of the opening as viewed in FIG. 9a is 28 inches so that the access is 24 inches by 28 inches to provide 4.67 square feet.

The fact that the plenum plate has the grommets for wiring and cooling allows installers to avoid custom cutting holes in expensive floor tiles. According to the present invention, the floor is installed and the cabinet is set on top of the open tile area. A small amount of sealant is applied to the bottom of the cabinet and the cabinets are slid into place. Time and money that is required for design, floor installation and floor tile custom cut openings below the cabinets subsequent to the installation is reduced dramatically, and flexibility for moving cabinets in the future is maintained.

FIG. 9c illustrates an arrangement of tiles according to the present invention employing fourteen tiles to support six cabinets. If six cabinets are arrayed in a group, the width of the six cabinets is one hundred sixty eight inches. Each tile is twenty four inches. So six cabinets fits seven tiles. With the cabinets arrayed in groups of six, no tile cutting is required.

FIG. 10 illustrates the edges of the tiles in a standard elevated floor supported on beams 64 and 66. The beams are supported on pedestals 65. In the present invention, the factory supplied partial tiles 58 and 60, as shown in FIG. 9d, are supported by beams 64 and 71. To prevent tiles 58 and 60 from sliding into open space 62, tiles stops 68 and 70 are employed. Tile stop 68 is secured under and to a grommet board 72 of the cabinet, which in turn is secured to beam 64 through a bottom wall of the cabinet. The tile stop has a downward extension 74 seated along an edge of the slab 58. As such, the cabinet and the tile stop are secured to the grommet board 72 and the extension 74 thereby preventing movement of the slab 58. Accordingly, the entire structure is integrated to insure that all elements of the structure remain in a fixed position relative to one another.

Figure 13:
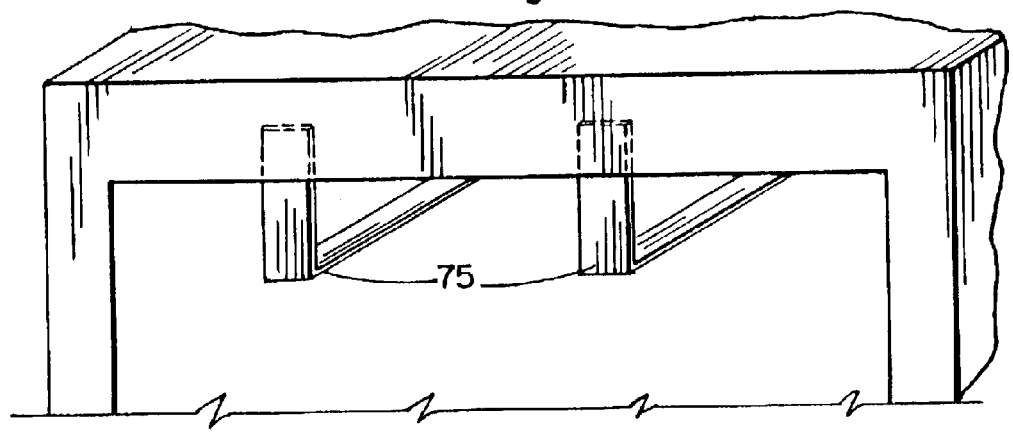
FIG. 13 illustrates the use of clearance bars to prevent blockage of the air flow through the top of the cabinet.

Referring to FIG. 13, bars 75 are suspended from the top of the cabinet frame to prevent materials from being placed close to the top wall of the cabinet, as this may impede air flow through the top wall. Accordingly, measures are present to insure unimpeded air flow into and out of the cabinet.

Figure 14:
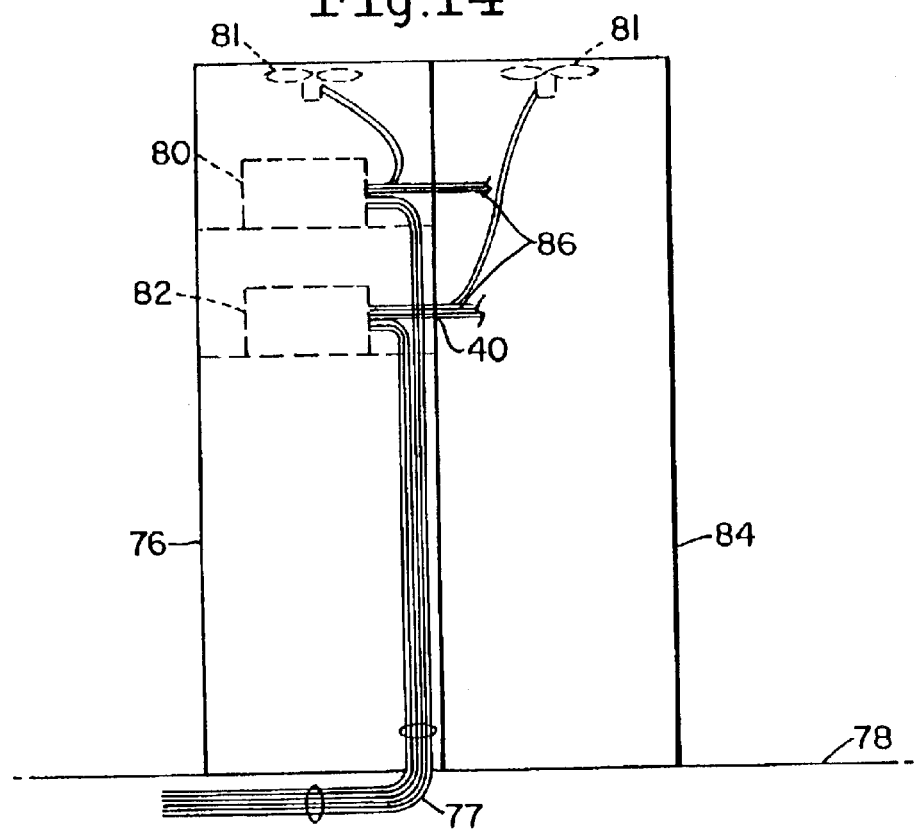
FIG. 14 illustrates the entry of wires and cables into one cabinet and the passage of wires and solid cables into an adjacent cabinet through the solid side wall panels with grommet holes for the wires.

FIG. 14 is a schematic illustration of the entry wires and cables into a cabinet and passage of such wires and cables into an adjacent cabinet. Specifically, a cabinet 76 receives cables and wires 77 from under the tile floor 78 through one of the grommets, as shown in FIG. 5. The wires and cables are connected to various pieces of equipment 80 and 82 and fans 81, and wires and cables 86 are taken from the equipment and incoming wires and cables into an adjacent cabinet 84. The cable openings 40 can be sealed tight about the wires and cables to prevent air flow between cabinets. For example, the solid wall panels between cabinets are designed with six two inch holes that are used to extend wires between adjacent cabinets without significantly affecting cooling performance between a lightly loaded and heavily loaded equipment cabinet.

Referring to FIG. 15, the apparatus of FIG. 1 is modified by replacing at least one of the panels 12 with a grommet bearing panel 32. If desirable, wires and cables 88 may be brought in from a cable tray or conduit 89 through such a grommet, i.e the plates of the grommet are notched to seal about the wires and cables 88. The grommet also provides control of air flow in and/or out through the top. In one embodiment, there may be multiple grommets provided. Alternatively, a gusseted slot can be used to accommodate the wires in place of a grommet. The arrangement of FIG. 15 illustrates three side-by-side cabinets 144, 146 and 148. Wires 88 are passed from cabinet 144 to cabinets 146 and 148, and other cabinets if present, through apertures 40 of the contacting side walls of the adjacent cabinet.

Figure 15A:
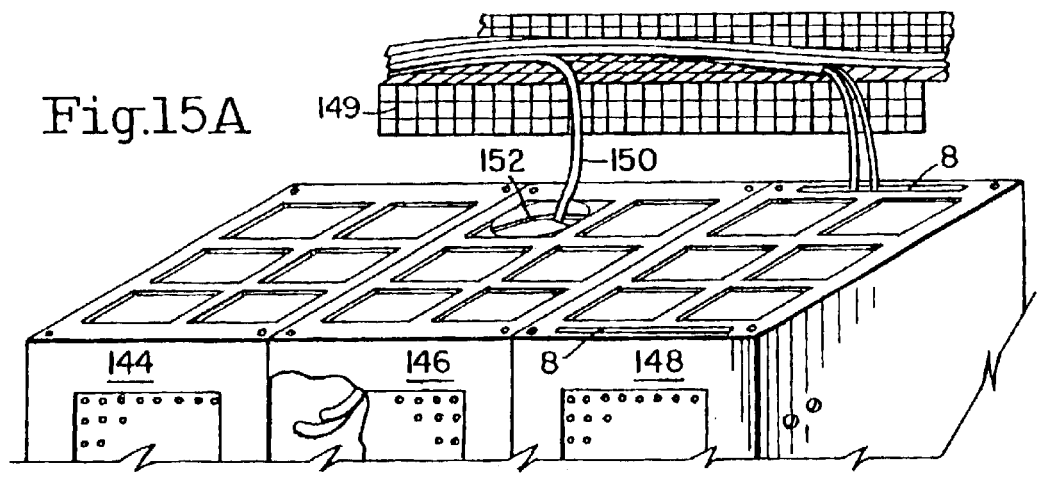
FIG. 15A is a detailed view of the top of the cabinets of FIG. 15.

FIG. 15a provides a modified view of the top of the cabinets 144, 146, and 148. Cables and wires 150 are brought down from a cable tray 149 rather than through a conduit, thus providing less complexity to these items. The wires and cables 150 extend into cabinet 146 through a grommet or gusseted slot 152 in the center cabinet 146 so that wires may extend in either or both directions into cabinets 144 and 148.

Figure 16:
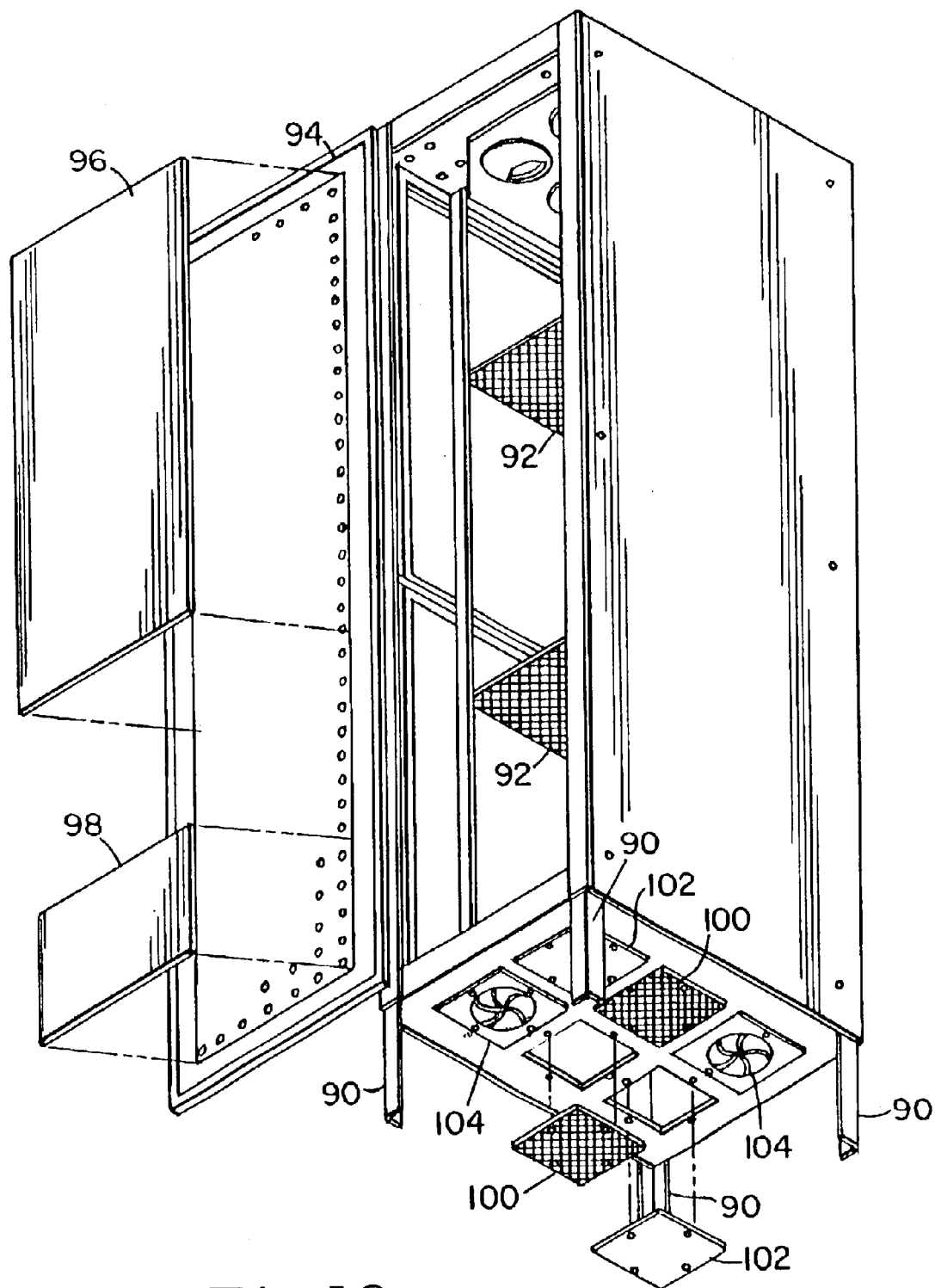
FIG. 16 illustrates the structure when employed in a situation in which cooling air is not supplied under the floor.

In the preferred embodiment, the cabinets are placed on a raised tile floor with pressurized cool air flowing within the confines of the floor and into the cabinets through openings in the bottom wall of the cabinets. FIG. 16 is an illustration of an alternative embodiment to permit use of the cabinet placed on a solid floor within an air conditioned room. The cabinet is used to induct ambient air that is supplementally cooled by a room air conditioning system through the perforations in the cabinet panels from, side, bottom or back panels. Thereafter, the air is drawn up through the computer equipment by induction fans mounted in the top wall of the cabinet. The cabinet can be placed on legs which are in direct contact with the floor. The induction fans can be mounted in the bottom plate to blow air up into the cabinet, if required. In this embodiment, the front and rear openings 36*a* are closed. Such an arrangement is employed to take advantage of the maximum volume of cold air in the lower regions of the room. The legs are of a length to provide unimpeded flow of air in through the bottom wall. In addition, the cabinet has perforated shelves 92, a front door 94, and door inserts 96 to provide control of air flow through a perforated region of the door. The panel may be solid or perforated to varying degrees. Similarly, inserts at the bottom wall, such as porous, solid or fan accommodating panels 100, 102, 104, respectively, may be provided. Accordingly, the cabinet shown in FIG. 16 differs from the cabinet of the preferred embodiment, as shown in FIG. 1, in that it has legs to hold it in a raised position.

Figure 19:
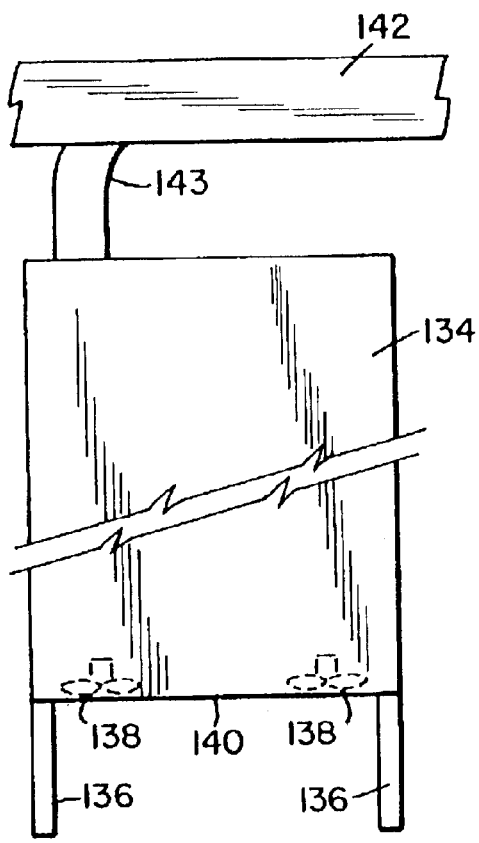
FIG. 19 illustrates the use of overhead ducting to provide cool air to, or exhaust air from, the cabinet.

FIG. 16 is an illustration of an alternative embodiment to permit use of the cabinet placed on a solid floor within an air conditioned room and with overhead ducting for the wires. The cabinet is used to induct ambient air that is supplementally cooled by a room air conditioning system through the perforations in the cabinet panels from, side, bottom or back panels. Thereafter, the air is drawn up through the computer equipment by induction fans mounted in the top wall of the cabinet. The cabinet 134 can be placed on legs 136 which are in direct contact with the floor. The induction fans 138 can be mounted in the bottom plate 140 to blow air up into the cabinet, if required. In this embodiment, the front and rear openings 36*a* are closed. Such an arrangement is employed to take advantage of the maximum volume of cold air in the lower regions of the room. The legs are of a length to provide unimpeded flow of air in through the bottom wall. A passage 143 is provided to house wires extending between the cabinet 134 and overhead ducting 142. Accordingly, the cabinet shown in FIG. 19 differs from the cabinet of the preferred embodiment, as shown in FIG. 1, in that it has legs to hold it in a raised position.

Figure 17:
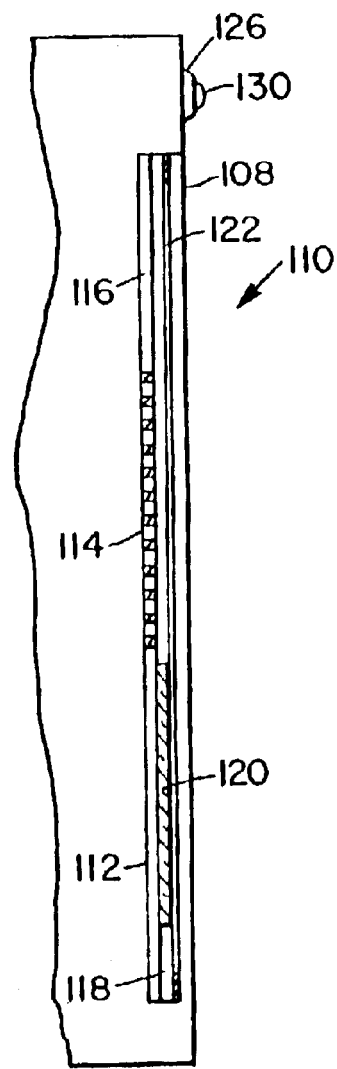
FIG. 17 illustrates a slide to control room ambient air flow through the door.

The system of the cabinet in conjunction with air flow may be modified for different environments to maintain an air conditioning unit supplying the cool air within it's capacity range. For example, in one embodiment, no fans are used. Convection flow in the cabinet inducts sufficient room air to control temperature in the cabinet. The cabinet door of FIG. 17 is recommend in this example. The door 108 includes a perforated panel 112 having a perforated central region 114 with a solid top region 116 and a solid bottom region 118. A solid slide 120 in the uppermost position covers the perforated region of the panel 112 and blocks air flow through the door. The panel 120 is illustrated in its lowermost position and exposes the perforations in the panel 112. The panel may be positioned to expose perforation 114 to varying degrees and thus control flow through the door. The panels and slide are retained by a further panel 122 that engages the edges of the panels. The panels are fabricated from a transparent material, such as clear plastic, so that the interior of the cabinet and the items stored therein are visible.

Figure 18:
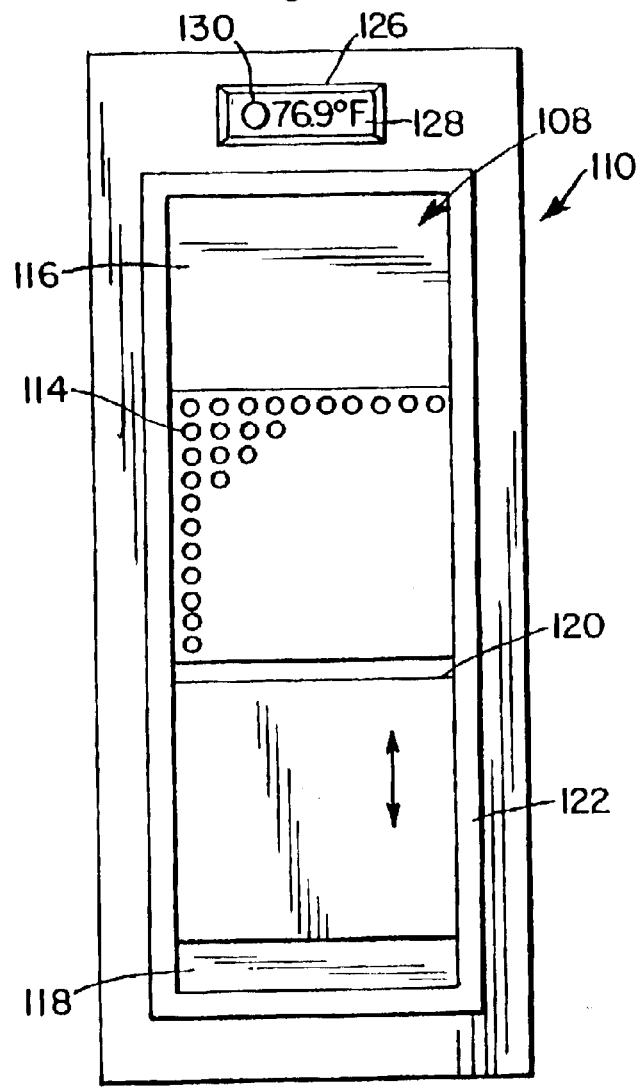
FIG. 18 illustrates the overheat alarm and microprocessor display.
Figure 18A:
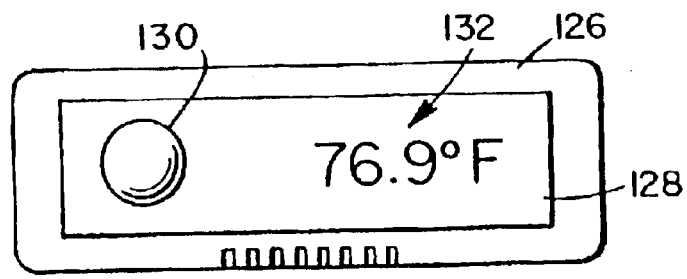
FIG. 18A illustrates the overheat alarm in detail.

FIG. 18 is an illustration of the front of a cabinet showing the details of the slide 120 and its associated structure. The slide 120 is shown as partially depressed to expose the perforations 114 in panel 112. The panel 122 retains all elements in place. At the top of the cabinet above the door 108 is an opening 126 behind which a temperature indicator, a warning light 130, and an audible alarm situated to monitor the interior environment of the cabinet. The temperature sensor may be a thermistor. The light 130 sticks out of the cabinet so that it may be observed from a wide range of positions in the room. If overheating within the cabinet occurs, the light 130 will brighten and the audible alarm will sound to indicate the condition. FIG. 18*a* illustrates the details of a unit 132 including the indicator 128 and light 130. The unit 132 may also include a visual display and an audible alarm in communication with an integrated circuit to provide monitoring over a local area network.

Figure 20:
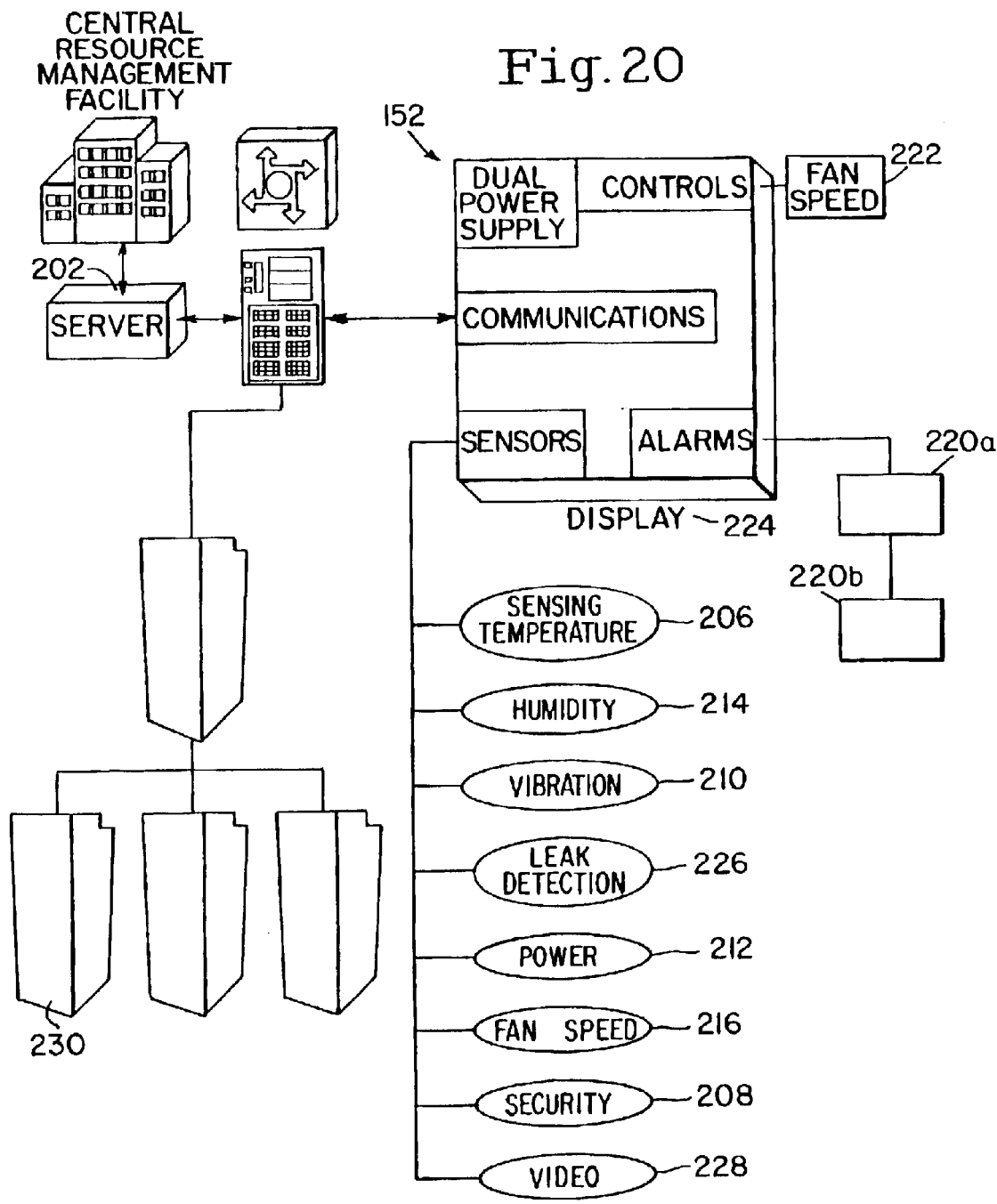
FIG. 20 is an illustration of a network of micro controllers.

In a further embodiment, the temperature monitor may be incorporated into an input/output micro controller. A logic diagram 200 for the control system within the micro controller is shown in FIG. 20. The micro controller is adapted to control and monitor a plurality of variants with the cabinet. Such variants may include temperature, power, door access, vibration, humidity, fan speed, and other measurable and controllable elements within the cabinet. Each cabinet 230 may include a power supply to provide power to all equipment stored within the cabinet. The micro controller receives power from the cabinet power supply. The micro controller may include a visual display to convey visual information to an operator of the cabinet. This enables an operator in close proximity of the cabinet to monitor variants within the cabinet without physically accessing the cabinet. In addition, the micro controller may include a light emitting diode (LED) to visually convey a message to an operator of the cabinet. For example, the LED may include different colors, with each color being indicative of a condition within the cabinet. As the LED changes to a warning color, such as red, this may be visible from a distance across the room. Accordingly, the micro controller includes different instruments for conveying information to an operator of the cabinet without requiring access to an interior portion of the cabinet.

The individual micro controller of each cabinet may be connected into a network so that a plurality of micro controllers for an array of cabinets may be monitored in aggregate. For example, the network of micro controller may be connected through a local area network (LAN), a wide area network (WAN), or through a global communication network such as the Internet. The network of micro controllers may be wired or in some cases they may be wireless. Accordingly, each individual cabinet in an array of cabinets includes a micro controller as a part of a network of micro controllers, wherein the micro controller manages the measurable and controllable variants within each cabinet.

Each micro controller within the network monitors the variants within a specific cabinet. As shown in FIG. 20, the micro controller includes the following inputs: temperature 206, security 208, vibration 210, power 212, humidity 214, fan speed 216, leak detection 226, alarm silence 218, video 228, a visual alarm 220*a*, and an audible alarm 220*b*. In addition, the micro controller may be designed to accommodate additional inputs as deemed necessary. The micro controller also may include the following outputs: an alarm 220, and fan speed 222. Finally, the microprocessor may include a display 224 which enables both input and output functions.

The network of micro controllers may include a server 202 to monitor the network. The server 202 includes a memory addressable system adapted to send a message to the operator of the cabinets to convey specific information pertaining to the controllable variants. This enables a remote operator to receive specific cabinet information. The remote operator can also send information to a specific controller within the network. Such information can send communication information pertaining to any of the input variants in individual cabinets, as well as the room within which the cabinets are stored. Alternatively, the remote operator can convey the information to an operator physically close to the cabinets to make any necessary modifications to the operation of the cabinet. In an array of multiple cabinets, it is important to have a central server 202 to be able to monitor the variants in each cabinet, and to modify any of the controls necessary to enable the equipment stored within a cabinet to continue operation. Furthermore, in a memory addressable system, the remote operator can electronically communicate with a local operator. This enables an array of cabinets to be monitored from any remote location wherein the remote operator can electronically communicate with the server. Accordingly, the network of micro controller enables remote and/or local operation of the cabinets.

As shown in FIG. 20 each cabinet has a power supply 152. The power supply may be in the form of a single source power cord processor or a dual source power cord processor. In the case of a dual source power cord processor, each processor in the power supply may receive power from an alternative source. If one of the processors should fail, the other processor would continue to operate. This enables the failure to be transparent to the equipment in the cabinet receiving power from the dual processor power cord. Accordingly, the dual source power cord processor enables the electronic equipment to remain operational in the event of a partial failure from the power source.

As shown in FIG. 1, the top wall includes six openings, with each opening adapted to receive a panel. The operator of the cabinet may select from the array of inserts shown in FIGS. 4A, 4B, 4C, 4D, and 4E. In a preferred embodiment, each of the six openings will receive a panel with a variable speed fan, as shown in FIG. 4C. Each of the fans preferably receives power from the dual source power cord processor. The eliminates the reliance of the fans on a single power source. The fans are an important element for maintaining an operable temperature within the interior of the cabinet. As such, the fans are preferably in communication with the micro controller of the cabinet. This enables the fans to be monitored and controlled without requiring entry into the cabinet. For example, the micro controller may vary the speed of a specific fan or all of the fans at any time. This allows the operator of the cabinets to conserve energy. In the case where the electronic load within the cabinet is low enough to allow passive convection for sufficient ventilation of the equipment, the micro controller can turn each of the fans off. In the event the fans are turned off and later need to be turned on, the process of turning on the fans can also be operated through the micro controller. It is preferred that when the fans are turned on from an off position, they are initially placed on a high speed setting to provide sufficient starting torque. After an initial time period, the fans may be set to a normal or lower operating speed. All operation of the fans is controlled and monitored through the micro controller. Accordingly, the use of a plurality of small fans in the top panel in combination with the micro controller enable economic and efficient operation for cooling the cabinet, wherein the variable operation of the fans allows the energy consumption for the fans to remain proportional to the cabinet load, conserving UPS power.

Advantages Over The Prior Art

The cabinet design teaches several embodiments that are improvements over prior art cabinets for storing electronic and telecommunication equipment. The micro controllers, and in an array of cabinets a network of micro controllers, are used to monitor and control a plurality of variants within each cabinet. The micro controller does not merely monitor the situation, rather the control can modify operation of the cabinet itself. For example, the micro controller can control the properties of the fans, which ones to operate, speed, and specific time intervals for modifying operation of the fans maintaining less than 10% of UPS power diverted from the computers to the fans. Furthermore, the micro controllers may be placed in a network in communication with a server, thereby enabling the network of micro controllers to function as a memory addressable system. In addition, the use of the dual cord processor ensures continued operation of the cabinet and the equipment stored in the cabinet. Failure of one of the processors or power source is transparent to the remaining equipment in communication with the failed processor. Accordingly, the novel embodiments disclosed herein provide improved operation, monitoring and control of the cabinets and the equipment housed therein.

Alternative Embodiments

It will be appreciated that, although specific embodiments of the invention have been described herein for purposes of illustration, various modifications may be made without departing from the spirit and scope of the invention. In particular, a line voltage non-processor thermal device may be provided to turn each of the fans in a cabinet to a high speed in the event of failure of the micro controller monitoring and controlling variants within the cabinet. Accordingly, the scope of protection of this invention is limited only by the following claims and their equivalents.

I claim:

1. A system for cooling a cabinet containing heat producing elements comprising:
   a top wall having an opening;
   a bottom wall having a variable size opening therein;
   an interior having a primary shelf mounted in a fixed position, said shelf is positioned to enable flow of cooling gas through said variable size opening and to permit access to said variable size opening;
   a plurality of panels selectively insertable into said opening in said top wall, wherein one of said panels is adapted to control flow of air through said opening in said top wall;
   means for inducting cool ambient air into said cabinet; and
   means for dynamically controlling conditions within said cabinet.

2. The system of claim 1, wherein said cabinet condition control means includes an input/output micro controller.

3. The system of claim 2, wherein said micro controller is adapted to monitor variants within said cabinet.

4. The system of claim 3, wherein said variants are selected from the group consisting of: temperature, power, door access, vibration, humidity, fan speed, and combinations thereof.

5. The system of claim 2, wherein said micro controller is adapted to be in communication with a power supply for said cabinet.

6. The system of claim 5, wherein said micro controller includes a visual display section to visually convey a condition within said cabinet to an operator.

7. The system of claim 5, wherein said micro controller includes a light emitting diode adapted to visually convey a message to an operator, wherein a color of said light emitting diode is determinative of a condition within said cabinet.

8. The system of claim 1, further comprising a plurality of micro controllers with each micro controller in communication with a power supply of an individual cabinet and said plurality of micro controllers are connected through a network.

9. The system of claim 8, wherein said network is selected from the group consisting of: a local area network, a wide area network, a wired network, a wireless network, a global communication network, and combinations thereof.

10. The system of claim 8, further comprising a server to monitor said network.

11. The system of claim 10, wherein said server includes a memory addressable system adapted to send a message to an operator at a remote location to convey operating conditions within individual cabinets.

12. The system of claim 2, wherein said micro controller is adapted to balance variants among a plurality of cabinets in a single room.

13. The system of claim 1, further comprising a dual source power cord processor adapted to deliver current to electronic equipment within said cabinet.

14. The system of claim 13, wherein each processor of said dual source power cord is adapted to receive power from a separate source and failure of a single processor is transparent to electronic equipment in communication with said dual source power cord processor.

15. The system of claim 1, wherein said air inducting means includes six variable speed fans.

16. The system of claim 15, wherein said fans are adapted to receive power from a dual source power supply to eliminate reliance of said fans upon a single power supply.

17. The system of claim 15, wherein said condition controlling means is adapted to vary operating speed and power consumption of said fans.

18. The system of claim 15, wherein said condition controlling means is adapted to turn said fans to an off position if heat produced by an electronic load in said enclosure is sufficient to allow passive convection ventilation.

19. The system of claim 15, wherein said condition controlling means is adapted to initiate operation of said fans on a high rotation setting to provide sufficient start torque.

20. The system of claim 15, wherein said fans include a backdraft assembly adapted to prevent loss of capacity.

21. The system of claim 1, further comprising a line voltage controller adapted to manage air inducting means if said condition controlling means fail to operate.

22. The system of claim 1, wherein said top wall is secured to walls of said cabinet by means of a captive fastener.

23. The system of claim 1, wherein said fan includes a backdraft assembly adapted to prevent loss of capacity associated with an inoperable fan.

24. A method for cooling a cabinet containing heat producing elements comprising:
said cabinet having an interior with a top wall having an opening, and a bottom wall having a variable size opening therein;
positioning a shelf for enabling flow of cooling gas through said variable size opening and permitting access to said variable size opening;
selectively inserting a panel into said top wall opening for controlling air flow through said opening;
inducting cool ambient air into said cabinet; and
dynamically controlling conditions within said cabinet by means of an input/output micro controller.

25. The method of claim 24, further comprising said micro controller monitoring variants within said cabinet.

26. The method of claim 25, wherein said variants are selected from the group consisting of: temperature, power, door access, vibration, humidity, fan speed, and combinations thereof.

27. The method of claim 24, further comprising connecting a plurality of micro controllers through a communication network.

28. The method of claim 27, further comprising monitoring said network through a server.

29. The method of claim 28, further comprising sending a message from a micro controller within said network to a remote location for conveying operating conditions within an individual cabinet in an array of cabinets.

30. The method of claim 24, further comprising balancing variants among a plurality of cabinets in a single room.

31. The method of claim 24, further comprising delivering current to electronic equipment within said cabinet through a dual source power cord processor.

32. The method of claim 31, wherein each processor of said dual source power cord is adapted to receive power from a separate source and failure of a single processor is transparent to electronic equipment in communication with said dual source power cord processor.

33. The method of claim 24, further comprising a inducting cool air into said cabinet through a plurality of variable speed fans.

34. The method of claim 24, further comprising securing said top wall to said cabinet with a captive fastener.

* * * * *